United States Patent
Amrutur et al.

(10) Patent No.: US 8,224,604 B1
(45) Date of Patent: Jul. 17, 2012

(54) GATE DELAY MEASUREMENT CIRCUIT AND METHOD OF DETERMINING A DELAY OF A LOGIC GATE

(75) Inventors: Bharadwaj Amrutur, Bangalore (IN); Bishnu Prasad Das, Khurda (IN)

(73) Assignee: Indian Institute of Science, Bangalore (IN)

(*) Notice: Subject to any disclaimer, the term of this patent is extended or adjusted under 35 U.S.C. 154(b) by 422 days.

(21) Appl. No.: 12/539,372

(22) Filed: Aug. 11, 2009

(51) Int. Cl.
   *G01R 29/00* (2006.01)
   *G06F 11/26* (2006.01)

(52) U.S. Cl. ............ 702/79; 702/89; 702/117; 702/124; 327/153

(58) Field of Classification Search .................... 702/79, 702/89, 117, 124, 125
   See application file for complete search history.

(56) References Cited

U.S. PATENT DOCUMENTS

| | | | | |
|---|---|---|---|---|
| 5,847,617 A | * | 12/1998 | Reddy et al. ..................... | 331/57 |
| 6,069,849 A | * | 5/2000 | Kingsley et al. ............... | 368/113 |
| 6,100,769 A | * | 8/2000 | An et al. ........................ | 331/57 |

OTHER PUBLICATIONS

Okada, K., Yamaoka, K., and Onodera, H., "A Statistical Gate-Delay Model Considering Intra-Gate Variability," in ICCAD, 2003, pp. 908-913.
Panganiban, J., "A Ring Oscillator Based Variation Test Chip," M. Engg. Thesis, MIT Department of Electrical Engineering and Computer Science, May 2002, pp. 1-174.
Ohkawa, S., Aoki, M., and Masuda, H., "Analysis and Characterization of Device Variations in an 1si Chip Using an Integrated Device Matrix Array," IEEE Trans. on Semiconductor Manufacturing, vol. 17, No. 2, May 2004, pp. 155-165.
Bassi, A., Veggetti, A., Croce, L., and Bogliolo, A., "Measuring the Effects of Process Variations on Circuit Performance by Means of Digitally-Controllable Ring Oscillators," in Microelectronic Test Structures, Mar. 17-20, 2003, pp. 214-217, DOI: 10.1109/ICMTS.2003.1197464.
Orshansky, Michael; Milor, Linda and Hu, Chenming, "Characterization of Spatial Intrafield Gate CD variability, its Impact on Circuit Performance, and Spatial Mask-Level Correction," IEEE Transaction on Semiconductor Manufacturing, Feb. 2004, vol. 17, No. 1, pp. 2-11.
Karl, E.; Singh, P.; Blaauw, D. and Sylvester, D., "Compact In-Situ Sensors for Monitoring Negative-Bias-Temperature-Instability Effect and Oxide Degradation," in Proceedings of IEEE International Solid-State Circuits Conference, ISSCC, Feb. 2008, pp. 410-411, 623.
Mukhopadhyay, Saibal; Kim, Keunwoo; Jenkins, K. A.; Chuang, Ching-Te and Roy, Kaushik, "Statistical Characterization and On-Chip Measurement Methods for Local Random Variability of a Process Using Sense-Amplifier-Based Test Structure," in Proceedings of IEEE International Solid-State Circuits Conference, ISSCC, Feb. 2007, pp. 400-401, 611.
Maggioni, S.; Veggetti, A.; Bogliolo, A. and Croce, L., "Random Sampling for On-Chip Characterization of Standard Cell Propagation Delay," in Proceedings of IEEE ISQED, Mar. 24-26, 2003, pp. 41-45.

(Continued)

*Primary Examiner* — Hal Wachsman
(74) *Attorney, Agent, or Firm* — McDonnell Boehnen Hulbert & Berghoff LLP

(57) ABSTRACT

A system and method to measure a delay of an individual logic gate in an unmodified form on a chip using a digitally reconfigurable ring oscillator (RO) that is on the chip is provided. A system of linear equations is established for different configuration settings of the ring oscillator and solved to determine a delay of an individual gate.

20 Claims, 7 Drawing Sheets

OTHER PUBLICATIONS

Zhou, B. and Khouas, A., "Measurement of Delay Mismatch due to Process Variations by Means of Modified Ring Oscillators," IEEE International Symposium on Circuits and Systems, ISCAS, May 23-26, 2005, pp. 5246-5249.

Abaskharoun, N., et al., "Circuits for On-Chip Subnanosecond Signal Capture and Characterization," IEEE Conf on Custom Integrated Circuits, 2001, pp. 251-254.

Bhushan, M., et al., "Ring Oscillators for CMOS Process Tuning And Variability Control," IEEE Trans. on Semiconductor Manufacturing, vol. 19, No. 1, Feb. 2006, pp. 10-18.

Das, B.P., et al., "Within-Die Gate Delay Variability Measurement using Re-configurable Ring Oscillator," IEEE Transactions on Semiconductor Manufacturing, May 2009, Vol: 22, Issue 2, pp. 4.

Masuda, H., et al., "Challenge: Variability Characterization and Modeling for 65- to 90-nm Processes," IEEE Custom Integrated Circuits Conference, 2005, pp. 593-600.

Sanda, P., et al., "Picosecond Imaging Circuit Analysis of the power3 clock distribution," in IEEE ISSCC, 1999, pp. 372-373.

* cited by examiner

GATE DELAY MEASUREMENT CIRCUIT AND METHOD OF DETERMINING A DELAY OF A LOGIC GATE

BACKGROUND

Typical digital circuit designs involve a high level of integration along with high data transmission rate requirements in the order of gigabytes per second, which necessitate an accurate timing analysis of the digital system. Timing analyses usually involve determining and accounting for delays present within the circuit design. To determine delays, measurements can be made on test circuits or models to determine delays of individual standard cells or logic gates within a programmable chip, for example.

Signal delays due to logic gates are due to switching times of transistors that comprise the logic gates. The switching times may be due to process variations in a semiconducting material on which the logic gate is fabricated. Typically, integrated circuits are produced in large batches on a single wafer of electronic-grade silicon (EGS) through processes such as photolithography. The wafer is cut into many pieces, each containing one copy of the circuit and each of these pieces is called a die. There are two types of process variations; inter-die or die-to-die variations (global), and intra-die or within-die variations (local).

Many techniques exist for measuring a delay of components of a circuit. For example, a Picosecond Imaging Circuit Analysis (PICA) can be used to obtain quantitative delay information from circuits. A very weak picosecond pulse of light is emitted by each field effect transistor (FET) in a complementary metal oxide semiconductor (CMOS) circuit whenever the circuit changes logic state. The pulsed emission can be imaged by counting a number of infra-red photons from a back side of the package chip. With a suitable imaging detector, PICA allows time resolved measurement on devices. However, the technique requires infra-red measurement ability, which makes the technique costly and tedious.

Another technique that may be used is a delay measurement based on delay lock loop (DLL) configuration to change a phase of a clock signal to enhance clock rise-to-data output valid timing characteristics. However, the complexity of the DLL configuration for an on-chip measurement circuitry solution limits its large scale implementation which may be needed for characterizing process variations.

Normally, the delay of a standard circuit component is quite small, and the delay can be amplified by cascading a number of circuit stages so that the delay of the individual cell is determined by averaging. However, it may be difficult to extract gate to gate delay variations from simple cascaded circuits, and modified or complicated cascaded circuitry is usually not a part of any standard cell library. Hence, this approach may not be suitable for delay mismatch measurement of standard cell library.

SUMMARY

A system is described, substantially as shown in and or described in connection with at least one of the figures, as set forth more completely in the claims, which provides a manner for determining a delay of a logic gate using a reconfigurable ring oscillator.

In one example aspect, a method of determining a delay of a logic gate is provided that includes providing a gate delay measurement circuit that includes a multi-stage ring oscillator and a logic gate under test within the multi-stage ring oscillator. The method also includes making a first measurement of a period of the gate delay measurement circuit with all stages of the multi-stage ring oscillator present, and making subsequent measurements of periods of the gate delay measurement circuit with one or more stages of the multi-stage ring oscillator removed while still enabling the multi-stage ring oscillator to oscillate. The method further includes determining a delay of the logic gate under test based on a linear combination of the first measurement of the period of the gate delay measurement circuit and the subsequent measurements of the periods of the gate delay measurement circuit.

In another example aspect, a gate delay measurement circuit is provided that includes a reconfigurable ring oscillator, a delay measurement element and a processor. The reconfigurable ring oscillator includes one or more stages that are arranged in a ring with an output of one stage being an input to a subsequent stage. The delay measurement element is coupled to the reconfigurable ring oscillator and operable to make a first measurement of a period of the reconfigurable ring oscillator with all stages of the reconfigurable ring oscillator present and to make subsequent measurements of periods of the reconfigurable ring oscillator with one or more stages of the reconfigurable ring oscillator removed while still enabling the reconfigurable ring oscillator to oscillate. The processor is coupled to the reconfigurable ring oscillator and to the delay measurement element and operable to output a configuration vector to the reconfigurable ring oscillator that includes a control word for each of the one or more stages. The control word controls whether a stage will be removed from the reconfigurable ring oscillator. The processor determines a delay of a logic gate under test within the reconfigurable ring oscillator based on a linear combination of the first measurement of the period of the reconfigurable ring oscillator and the subsequent measurements of the periods of the reconfigurable ring oscillator.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
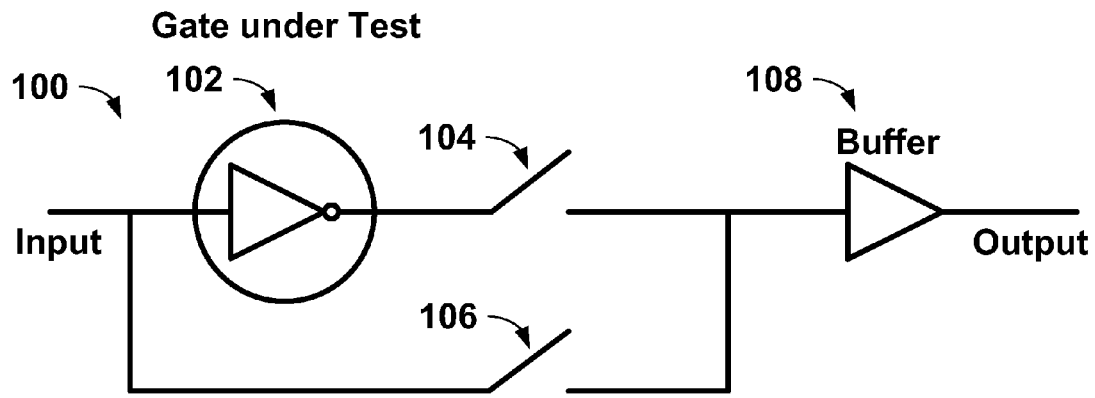
FIG. 1 illustrates an example configuration of a gate delay measurement cell.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present application provides a manner to measure a delay of a logic gate within a reconfigurable ring oscillator system. In-situ measurement of standard cell gate delays (e.g., including both inverting and non-inverting logic gates) in unmodified forms can be made. The measurement techniques are useful in measuring delay variation of logic gates due to local transistor variability, neighborhood effects, and voltage and temperature variations, for example. Thus, besides measuring device parameters such as threshold voltage, oxide thickness, transistor width, etc., a delay of individual standard logic gates can be directly measured.

The present application describes a system and method to measure a delay of an individual logic gate in an unmodified form on a chip using a digitally reconfigurable ring oscillator (RO) that is on the chip. A system of linear equations is established for different configuration settings of the ring oscillator and solved to determine a delay of an individual gate. Experimental results from a test chip in a 65 nm process node indicate that the delay of an individual inverter can be measured to within 1 ps accuracy. Delay measurements of different nominally identical inverters in close physical proximity showed variations of up to 26% indicating the large impact of local or within-die variations.

FIG. 1 illustrates an example configuration of a gate delay measurement cell 100. There are two paths between an input and an output of the cell 100, and a gate under test 102 is included within one of the paths. A difference of time that it takes for a signal to propagate between the two paths conceptually gives a delay of the gate under test 102. The cell 100 is shown to include two switches 104 and 106 to alternate which path is being used, and a buffer 108 to store the propagated signal.

Figure 2:
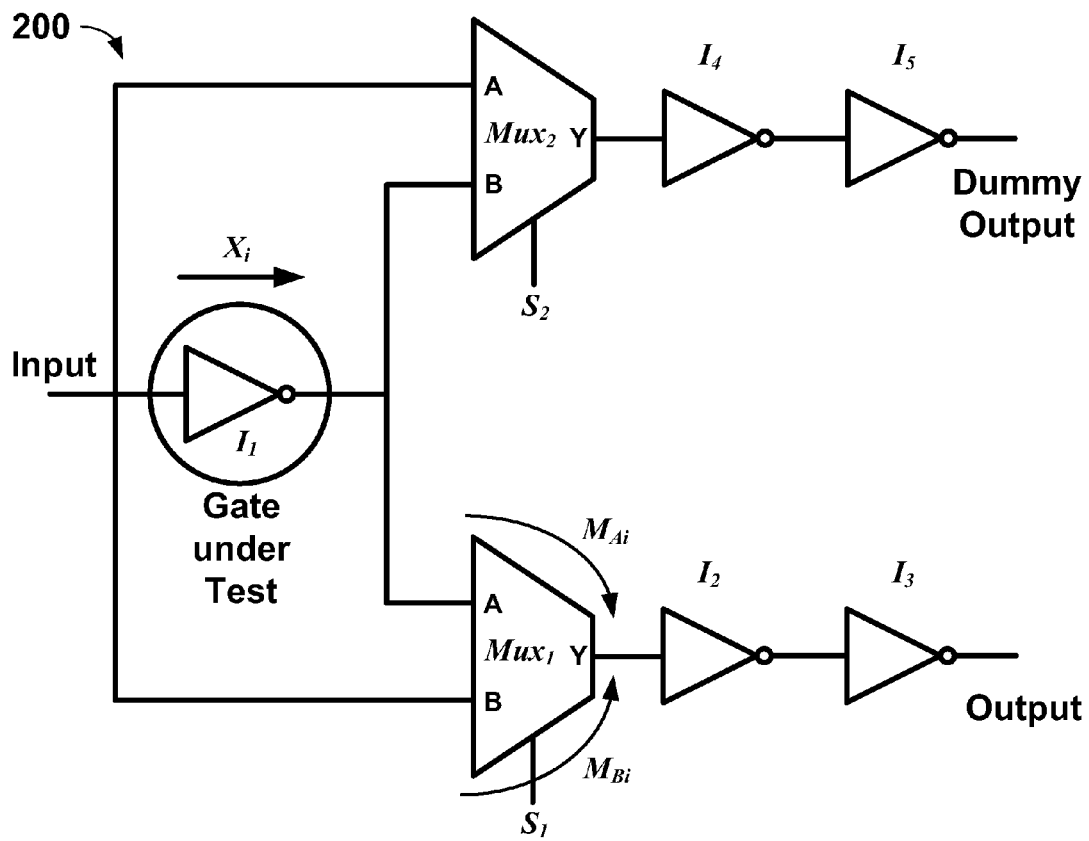
FIG. 2 illustrates an example schematic diagram of a gate delay measurement cell.

FIG. 2 illustrates an example schematic diagram of a gate delay measurement cell 200. This cell 200 includes an inverter $I_1$ that is the logic gate whose delay is to be measured. The inverter $I_1$ receives an input and outputs to two multiplexers, $Mux_1$ and $Mux_2$. The two multiplexers $Mux_1$ and $Mux_2$ also receive the input and a control signal $S_i$ that dictates which of the signals to pass through the multiplexer. The cell 200 also includes inverters $I_2$, $I_3$, $I_4$ and $I_5$ connected to outputs of the two multiplexers, $Mux_1$ and $Mux_2$, respectively. Inverters $I_2$ and $I_3$ are used for buffering an output, and inverters $I_4$ and $I_5$ are used for load matching the cell 200 and produce a "dummy output".

The multiplexer $Mux_1$ allows bypassing of the logic gate under test, by selecting the pathway from input B to output Y. A calculation of the logic gate's time delay can be made by taking a difference between a propagation time of the input to output through the multiplexer path of input B to output Y and a propagation time of the input to output through the multiplexer path of input A to output Y. The only difference between the two pathways is the propagation of the signal through the gate under test, so that the additional propagation time within the first pathway can be attributed to the delay of the gate under test.

Thus, the calculated delay of the logic gate under test will be a sum of the delay of the logic gate under test and the difference in path delays of the multiplexer $Mux_1$ (i.e., between input A to output Y and input B to output Y) due to unequal slew input to two inputs of $Mux_1$ for the two different mux setting inputs, $S_i$. Slew time is the time for a signal to transition from one logic state to another, and may be considered the time for a signal to transition from 10% to 90% voltage values. Slew time at the input of a logic gate can affect the delay through the logic gate.

The cell 200 in FIG. 2 is an example of a single stage ring oscillator. A ring oscillator includes inverters arranged in a ring with an output of one inverter being an input to the next inverter. An inverter is a logic device which very rapidly changes output states (from logic zero to logic one, for example) when its input crosses a threshold. The number of inverting gates in a ring oscillator could be odd so that the output of the ring oscillator oscillates from a logic zero state to a logic one state. Thus, there is no stable output state since the outputs of the ring oscillator alternate from a logic zero state to a logic one state.

No logic gate can switch instantaneously because a gate capacitance needs to be charged before current can flow between a source and a drain of the transistor. Thus, an output of every inverter of a ring oscillator changes a finite amount of time after an input has been received. Thus, adding more inverters to the chain of inverters in the ring oscillator increases a total gate delay and reduces a frequency of oscillation of the ring oscillator. A single logic gate can operate at a high frequency (e.g., a few picoseconds of delay). The resulting ring oscillator output frequency can be divided by the number of gates in the circuit and will be at a lower frequency than a single gate. Therefore, the ring oscillator's frequency is accessible to external equipment.

A measured delay time of a logic gate depends on a load at the output of the ring oscillator. To maintain an accurate measurement of the delay, inverters of the ring oscillator should delay the signal without distorting the signal, and the load at the output should be equal to or about equal to the input impedance of the inverter. The ring oscillator includes n=2k+1 inverters and the inverter delay time results to:

$$\tau_d = \frac{1}{2n \times f_{osc}},$$

where $f_{osc}$ is the oscillation frequency of the ring oscillator. The delay of the gate under test in the cell 200 can be calculated through two period measurements of the ring oscillator.

As mentioned, the input signal to the cell 200 is connected both directly and through inverter $I_1$ to the two inputs of the multiplexer $Mux_1$. The output Y of the multiplexer is driven out through inverters $I_2$ and $I_3$ that buffer the cell from configuration changes in any subsequent stages of the ring oscillator. Configuration changes can lead to small changes in capacitance, which can lead to a delay change. Without the inverter buffers $I_2$ and $I_3$, the delay of the gate under test can be exposed to changes in capacitance due to a reconfiguration of subsequent stages. Buffers $I_2$ and $I_3$ isolate any changes and ensure that the gate under test sees a uniform load capacitance irrespective of changes that occur in the rest of the circuitry. Thus, the inverters $I_2$ and $I_3$ help to isolate the gate under test from the rest of the cell 200.

Multiplexer $Mux_2$ and inverters $I_4$ and $I_5$ are a dummy structure used to provide equal loading to inverter $I_3$ of the previous stage independent of status of the select input of the multiplexers. Symmetric multiplexers of large size that have balanced delays between input A to output Y and input B to output Y can be used to reduce any further systematic mismatches. The sizes of multiplexer $Mux_1$ and inverters $I_2$ and $I_3$ can be the same as that of multiplexer $Mux_2$ and inverters $I_4$ and $I_5$, respectively. The multiplexers $Mux_1$ and $Mux_2$ are matched in the example cell 200 shown in FIG. 2.

The example cell 200 in FIG. 2 allows symmetry and load matching that helps to determine the gate delay of an individual logic gate. In the absence of process variations, all T-stage delays of the ring oscillator (where T is any odd number less than N, and N is a number of stages in the ring oscillator) should produce equal delays. In the absence of process variation, the delay of inverters $I_2$ and $I_3$ should be the same independent of the status of the control inputs $S_i$ to the multiplexer $Mux_1$.

Figure 3:
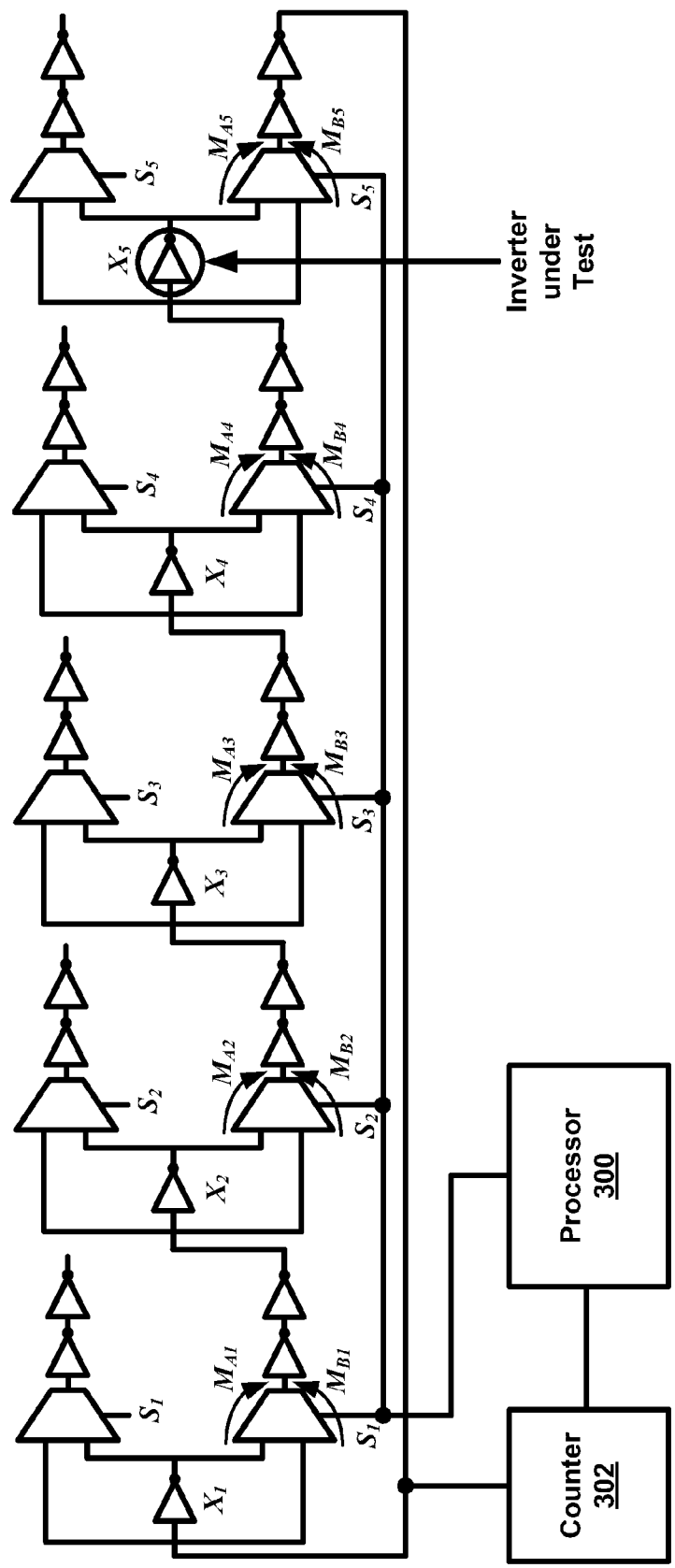
FIG. 3 illustrates one example of a 5-stage ring oscillator that may be used to measure a delay of an individual logic gate.

FIG. 3 illustrates one example of a 5-stage ring oscillator that is used to measure the delay of an individual logic gate. However, any number of stages of a ring oscillator may be used. For example, the ring oscillator may include a number of stages at least as long as a number of cells whose delay is being measured. Beyond that, extra stages can be added to insert additional delay to make a subsequent measurement of the oscillator's period easier to determine. For example, if a period measurement is performed off-chip, then inserting additional delay to increase the period can help to perform the measurement. However, for on-chip period measurements, additional delay may not need to be added and thus fewer stages can be used for the oscillator. Slowing down the ring oscillator period directly increases the measurement time because to obtain a certain amount of accuracy, a minimum number of period measurements need to be completed. Hence, a number of stages chosen is based on a compromise between a total measurement time and an ease of measurement of a single period.

Each of the first four stages of the ring oscillator includes a path with an odd number of inverters (e.g., three inverters) so that an output of each of the individual ring oscillator oscillates. The last ring oscillator includes an odd number of inverters as well, with one of the inverters being the logic gate under test. Thus, if the logic gate under test was not an inverting logic gate, then the last stage of the ring oscillator would require an additional inverter within the chain.

To measure the delay of an individual inverting gate, the example gate delay measurement circuit shown in FIG. 3 can be used, and a set of linear equations can be established and solved. Since, each ring oscillator cell within the circuit switches twice during a complete cycle, the sum of all the average ring oscillator cell delays equates to half a clock period of the ring oscillator signal, as shown below in Equation 1.

$$\sum_{i=1}^{5}(X_i + M_{Ai}) + K = \frac{T_1}{2} \qquad \text{Equation (1)}$$

Here, $X_i$ is an average of rise and fall delay (e.g., switching time) of the ith inverter under test, and $M_{Ai}$ and $M_{Bi}$ are delays between inputs A and B to output Y of the multiplexer (e.g., delay associated with time for signal to pass through the multiplexer). K is a delay of the rest of the elements of the ring oscillator, such as, the buffers including inverters of all the cells, the wires, etc. The inverters on a top path of each ring oscillator that provide the dummy output (e.g., inverters $I_4$ and $I_5$ as shown in FIG. 2) will not contribute to the frequency of the ring oscillator because those inverters are not part of the ring. The delays are average values of rise and fall delays. Let S be a configuration vector output from a processor 300 that includes 5 bits that controls a selection of inputs to each of the multiplexers in the 5-stage ring oscillator. For example, if $S_i=0$, then input A to output Y of the multiplexer $Mux_1$ of the ith stage ring oscillator is selected. If $S_i=1$, then input B to output Y of the multiplexer $Mux_1$ of the ith stage ring oscillator is selected. Thus, the processor 300 outputs a configuration vector that includes control words to control operation of stages of the ring oscillator so as to reconfigure the ring oscillator. $T_i$ is the period of the ith stage ring oscillator, and thus indicates the number of cycles through the ring oscillator before the output repeats (the period is the reciprocal of the frequency).

Equation 1 above follows for both inverting and non-inverting logic gates under test. In a ring oscillator, a single period is obtained by a rising edge signal traversing the ring followed by a falling edge signal traversing the ring. Hence a single period, T, is the sum of delays of rising and falling edges through each gate in the ring. In Equation 1, the $X_i$ represents the average of rising and falling delays of the gate, and hence the sum is equated to T/2.

A counter 302 may be coupled to the input of the gate delay measurement circuit (which is connected to the feedback loop) to count a number of cycles or increments for a signal to traverse through the gate delay measurement circuit (e.g., time difference from input to output of the gate delay measurement circuit) so as to calculate or measure a period of the gate delay measurement circuit. Other methods may be used as well to measure the period of the gate delay measurement circuit, such as, for example, by using a delay measurement logic element or device that may include a logic circuit designed to measure a period of time.

$T_1$, $T_2$, $T_3$ and $T_4$ are the period of the ring oscillators for four configuration vectors, such as S=00000, 00011, 00110, 00101 respectively, where the five bit control word for the select status vector controls each of the multiplexers in succession in the 5-stage ring oscillator illustrated in FIG. 3 (e.g., the most significant bit controls the first multiplexer in the chain, the next significant bit controls the second multiplexer in the chain and so on so that the least significant bit controls the last multiplexer in the chain). $T_1$, $T_2$, $T_3$ and $T_4$ do not refer to periods of the individual 1st, 2nd, 3rd, and 4th stages, but rather refer to the specific period of the resulting ring oscillator using configuration vectors $S_1$, $S_2$, $S_3$, and $S_4$, respectively.

A delay measurement of an inverting gate under test requires four configuration vectors or control words because each ring oscillator will switch twice during a complete cycle, and the sum of all the average ring oscillator cell delays equates to half a clock period of the ring oscillator signal. For example, for the ring oscillator cell to oscillate with an inverting gate under test, an odd number of ring oscillator stages is needed. Thus, to measure the delay of an inverting gate type, at least three stages of a ring oscillator are needed (to obtain an odd number of stages), and four different measurements are made. For example, a single stage of a logic gate connected as a ring (e.g., an output is connected to the input) does not oscillate, but rather a voltage signal settles down to a steady state DC value. Thus, more stages are needed.

The four different measurements include a delay with all of the stages present, and one measurement with stages in the ring oscillator removed while still maintaining an odd number of oscillators in the ring. Thus, to complete the odd-number of stages in the ring, at least three inverting stages are needed, and hence this dictates at least a 5-stage ring oscillator.

If the 3rd, 4th, and 5th stages are the three stages in the ring that are reconfigured, then one period measurement would be made with all three present, and three more measurements would be made with only one of the 3rd, 4th, and 5th stages present in the ring and the other couple removed. These four measurements can then be used to obtain the delay of each of the three gates individually within each ring that may be under test.

The processor 300 is coupled to the counter 302 within the gate delay measurement circuit illustrated in FIG. 3, and may receive an indication of the measured periods based on the reconfigured states of the ring oscillator. The processor 300 may alternatively receive information from the counter 302 and use the information to determine a period of a reconfigured state of the ring oscillator.

Figure 4:
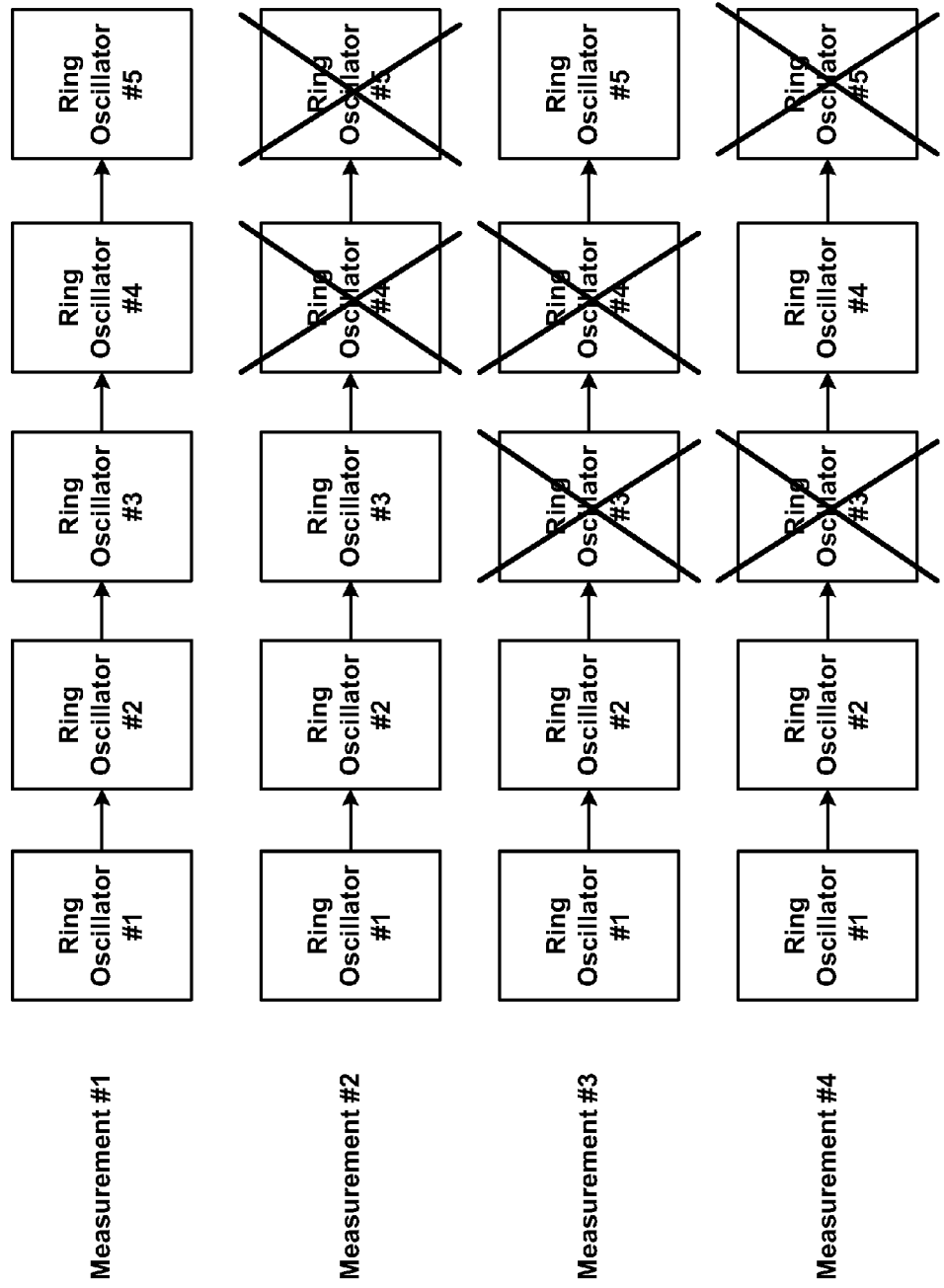
FIG. 4 illustrates an example block diagrams of 5-stage ring oscillators with the 3rd, 4th, and 5th stages being reconfigured.

FIG. 4 illustrates a block diagram of 5-stage ring oscillators with the 3rd, 4th, and 5th stages being the three stages in the ring that are reconfigured. A delay measurement is made with all stages present. A second delay measurement is made with the 1st, 2nd, and 3rd stages present. A third delay measurement is made with the 1st, 2nd, and 5th stages present. A fourth delay measurement is made with the 1st, 2nd, and 4th stages present. Other configurations are possible as well, such as including the 1st and/or 2nd stages as one of the reconfigurable stages, for example. At least three stages need to be reconfigurable, and more than three may be reconfigurable as well.

By removing the inverting gate under test from the ring, the number of inversions in the ring will be even, which will prevent the ring from oscillating. Thus, to measure the delay of the inverting gate under test, four separate measurements are made and pairs of inverters are removed at a time for each measurement, which leads to a requirement to make at least four measurements within a 5-stage ring oscillator for an inverting gate under test.

Since an odd number of ring oscillator stages is desired, the number of possible triplets formed using a 5-stage ring oscillator is $C(5,3)=10$. Also, because one measurement is made with each stage present, the total number of possible measurements is $C(5,3)+C(5,5)=11$, of which any 4 are made.

To measure a delay of a non-inverting gate delay, a minimum of a 4-stage ring oscillator is needed because the gate under test does not provide any inversion, and thus, a 4-stage ring oscillator (or an even number of stages) will enable the circuit to oscillate. Since an even number of ring oscillator stages is desired to measure the delay of a non-inverting gate type, the number of possible twins formed using a 4-stage ring oscillator is $C(4,2)=6$. Also, because one measurement is made with each stage present, the total number of possible measurements is $C(4,2)+C(4,4)=7$, of which any 4 are made.

When select status vector S=00000, then the input A to output Y of stages 1st, 2nd, 3rd, 4th, 5th are connected. Then, Equation 1

$$\left(\sum_{i=1}^{5} (X_i + M_{Ai}) + K = \frac{T_1}{2}\right)$$

follows to calculate the delay or propagation time of a signal through the 5-stage ring oscillator with all stages included (e.g., the propagation time of a signal through the 5-stage oscillator equates to half the period of the oscillator since it takes two cycles of the ring oscillator before the output repeats).

When select status vector S=00011, then the input A to output Y of stages 1st, 2nd, 3rd are connected and the input B to output Y of stages 4th and 5th are connected, and the delay or propagation time of a signal through the 5-stage ring oscillator is calculated with the 1st, 2nd and 3rd stages included as follows:

$$\sum_{i=1}^{3} (X_i + M_{Ai}) + \sum_{i=4}^{5} M_{Bi} + K = \frac{T_2}{2} \qquad \text{Equation (2)}$$

Taking the difference between Equation (1) and (2) gives the delay of the 5-stage ring oscillator with only the 4th and 5th stages included:

$$X_4+M_{A4}+X_5+M_{A5}-M_{B4}-M_{B5}=(T_1-T_2)/2 \qquad \text{Equation (3)}$$

When select status vector S=00110, then the input A to output Y of stages 1st, 2nd, 5th are connected and the input B to output Y of stages 3rd and 4th are connected, and the delay of the 5-stage ring oscillator with the 1st, 2nd and 5th stages included is calculated as follows:

$$\sum_{i=1,2,5} (X_i + M_{Ai}) + \sum_{i=3}^{4} M_{Bi} + K = \frac{T_3}{2} \qquad \text{Equation (4)}$$

When select status vector S=00101, then the input A to output Y of stages 1st, 2nd, 4th are connected and the input B to output Y of stages 3rd and 5th are connected, and the delay of the 5-stage ring oscillator with the 1st, 2nd and 4th stages included is calculated as follows:

$$\sum_{i=1,2,4} (X_i + M_{Ai}) + \sum_{i=3,5} M_{Bi} + K = \frac{T_4}{2} \qquad \text{Equation (5)}$$

Taking the difference between Equation (4) and (5) gives the delay of the 5-stage ring oscillator with only the 4th and 5th stages included:

$$-X_4-M_{A4}+X_5+M_{A5}+M_{B4}-M_{B5}=(T_3-T_4)/2 \qquad \text{Equation (6)}$$

Adding the Equations (3) and (6) to cancel out the delay of the 4th stage provides:

$$X_5+(M_{A5}-M_{B5})=(T_1-T_2+T_3-T_4)/4 \qquad \text{Equation (7)}$$

Period measurements of the ring oscillator $T_1$-$T_4$, with four different control word settings lead to Equation (7) for the delay of the inverter in the 5th stage along with a residual error term ($M_{A5}$-$M_{B5}$), which is the time difference between input A to output Y and input B to output Y delays of the multiplexer $Mux_5$ (e.g., slew time differences). However, unequal slew rates at the two inputs of $Mux_5$ for the different multiplexer settings that contribute to the residual delay error between the A, B inputs and the Y output have been observed to be about 1.2 picoseconds from circuit simulations in the absence of process variations. Thus, the error term is minimal.

Using the above set of linear equations though, the residual error term for any multiplexer delay mismatch cancels out a global transistor variation component term leaving behind only a local variation term. Manufactured chips will have some random fluctuations in characteristics of transistors contained therein, and the random fluctuations are referred to as global and local. Global fluctuations are those that occur between chips and all transistors in the same chip see the same value. Global fluctuations could arise from different fabrication conditions (e.g., temperature) during manufacturing of the chip. Local fluctuations are those that affect each gate locally and differently. Thus, subtracting the delay of two gates on a chip approximately cancels the global component as each global component will be the same or about the same for both the gates. Thus, the delay of the gate under test (e.g., rise and fall time, $X_5$) includes nominal delay plus a local variation term.

If the residual error term for any multiplexer delay mismatch (e.g., ($M_{A5}$-$M_{B5}$)) is considered approximately zero, then from Equation (7) above, $X_5$ can be considered to be about equal to a linear combination of the periods $T_1$, $T_2$, $T_3$ and $T_4$ that refer to the specific period of the resulting ring oscillator using configuration vectors $S_1$, $S_2$, $S_3$, and $S_4$, respectively:

$$X_5=(T_1-T_2+T_3-T_4)/4 \quad \text{Equation (8)}$$

Using a selection of different control words gives the delay of an inverting gate delay under test within a different stage of the ring oscillator. Table 1 below lists the control words to determine each of the $X_i$ gate delays.

TABLE 1

| $X_i$ | $S_1$ | $S_2$ | $S_3$ | $S_4$ |
|---|---|---|---|---|
| $X_1$ | 00000 | 11000 | 01100 | 10100 |
| $X_2$ | 00000 | 01100 | 10100 | 11000 |
| $X_3$ | 00000 | 01100 | 11000 | 10100 |
| $X_4$ | 00000 | 00011 | 00101 | 00110 |
| $X_5$ | 00000 | 00011 | 00110 | 00101 |

The control word setting for the ith gate under test, e.g., $S_i$, will vary from an off-on-off-on logic condition, as seen above. Other control words can be used as well that vary from the examples listed in Table 1 to obtain the gate delays of the ith gate under test.

As seen from Table 1 above, a triplet of stages is varied or reconfigured and a gate delay within one of the reconfigured stages can be determined using the linear set of equations. If the 3rd, 4th, and 5th stages are the three stages in the ring that are reconfigured, then a gate delay within any of the 3rd, 4th, or 5th stages may be determined. One period measurement would be made with all three present, and three more measurements would be made with two of the three not removed for each measurement and each one removed only once, for example (as illustrated in FIG. 4).

These four measurements can then be used to obtain the delay of each of the three gates individually within each ring that may be under test.

For the cell to oscillate with an inverting gate under test, an odd number of stages is needed. By removing the inverting gate under test from the ring, the number of inversions in the ring will be even, which will prevent the ring from oscillating. Thus, pairs of inverters are removed at a time, which leads to a requirement to make at least four measurements within a 5-stage ring oscillator. For example, a minimum number of stages required to make the delay measurement is four for non-inverting or five for inverting gate delay measurements, respectively. Since an odd number of stage ring oscillators can be formed, the number of equations formed using a 5-stage ring oscillator is C(5,5)+C(5,3)=11 and number of variables (e.g. gate delays to be measured) is 5.

The Equations (1)-(7) above may be reconfigured using any of the available number of equations, and thus, calculated gate delays can be cross checked across many different measurements.

The example described above illustrates the on-chip measurement of an inverting gate delay. However, if the inverter $I_1$ in FIG. 2 is replaced with any non-inverting gate, then the delay of the non-inverting gate can also be measured using the same technique. The delay of non-inverting gate can also be measured with only four configuration vectors or control words.

In a non-inverting gate stage, each stage will have an even number of inversions. Thus, a single stage can be removed and still preserve the criteria of an odd number of inversions for a ring oscillator to enable the oscillation. Thus, two measurements, one with all the stages present in the ring and another with the specific stage removed, can be made. Subtraction of the two periods will yield a delay of the non-inverting gate under test.

Figure 5:
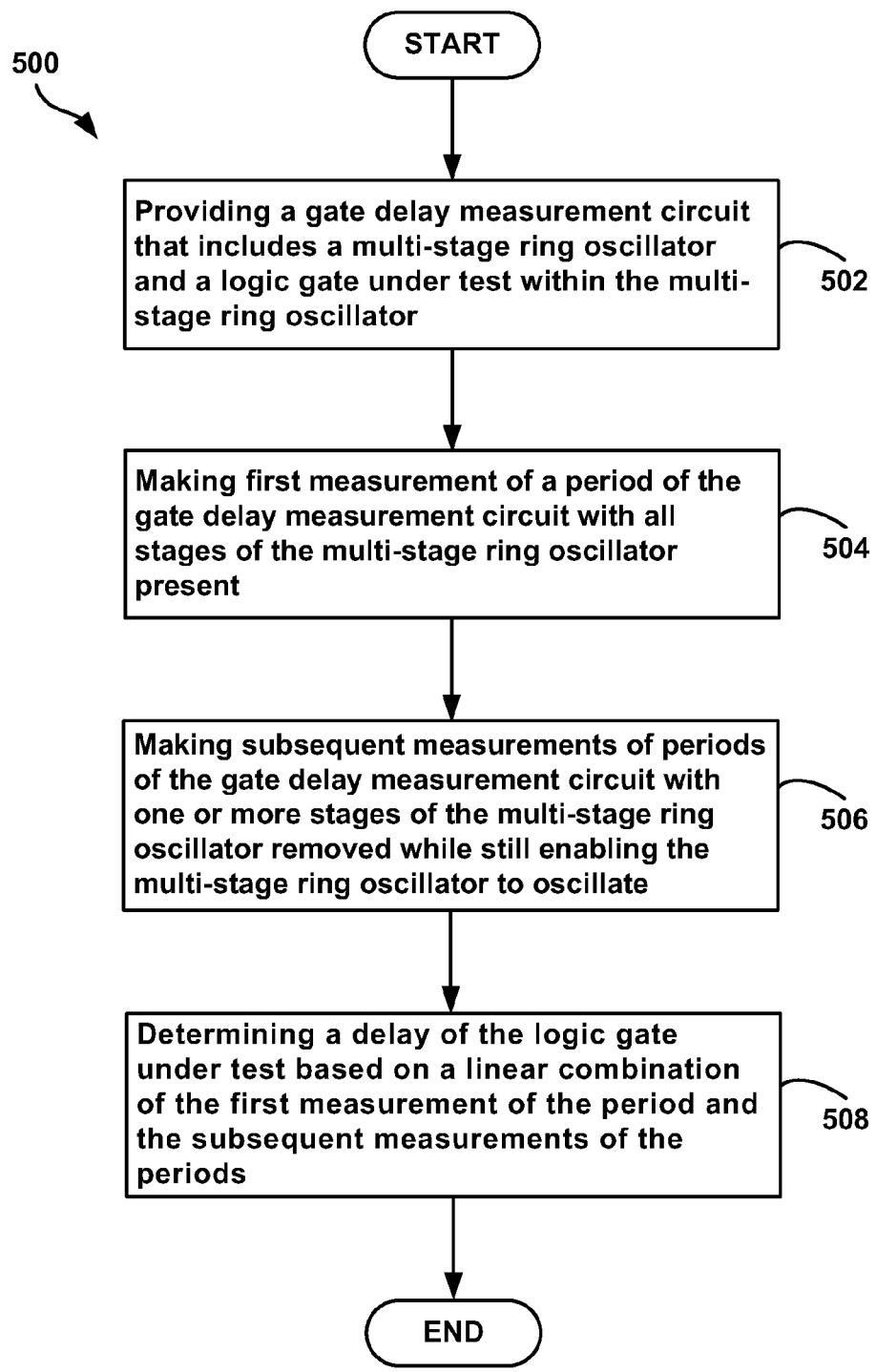
FIG. 5 illustrates an example flowchart including example functional steps for measuring the delay of a gate using a reconfigurable ring oscillator.

FIG. 5 illustrates an example flowchart including example functional steps 500 for measuring the delay of a gate using a reconfigurable ring oscillator. It should be understood that the flowchart shows the functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. In addition, each block may represent circuitry that is wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Initially, as shown at block 502 in FIG. 5, a gate delay measurement circuit is provided that includes a multi-stage ring oscillator (e.g., as shown in FIG. 3) and a logic gate under test within the multi-stage ring oscillator. Next, as shown at block 504, a first measurement is made of a period of the gate delay measurement circuit with all stages of the multi-stage ring oscillator present.

Subsequently, measurements of periods of the gate delay measurement circuit are made with one or more stages of the multi-stage ring oscillator removed while still enabling the multi-stage ring oscillator to oscillate, as shown at block 506. As discussed above, pairs of stages of the ring oscillator can be removed to enable the ring oscillator to still oscillate.

Lastly, as shown at block 508, a delay of the logic gate under test is determined based on a linear combination of the first measurement of the period of the gate delay measurement circuit and the subsequent measurements of the periods of the gate delay measurement circuit. The delay may be determined by, for example, selectively combining the linear equations in a manner so as to cancel delays of all logic gates except the delay of the logic gate under test.

An example simulation was performed using a layout of a test chip with a distribution of ring oscillators and a divider to slow down a frequency because the I/O had a frequency limitation of 100 MHz. Each gate's delay measurement requires period measurements for four different oscillator configurations for an inverting gate under test as described in Equation (8).

Figure 6:
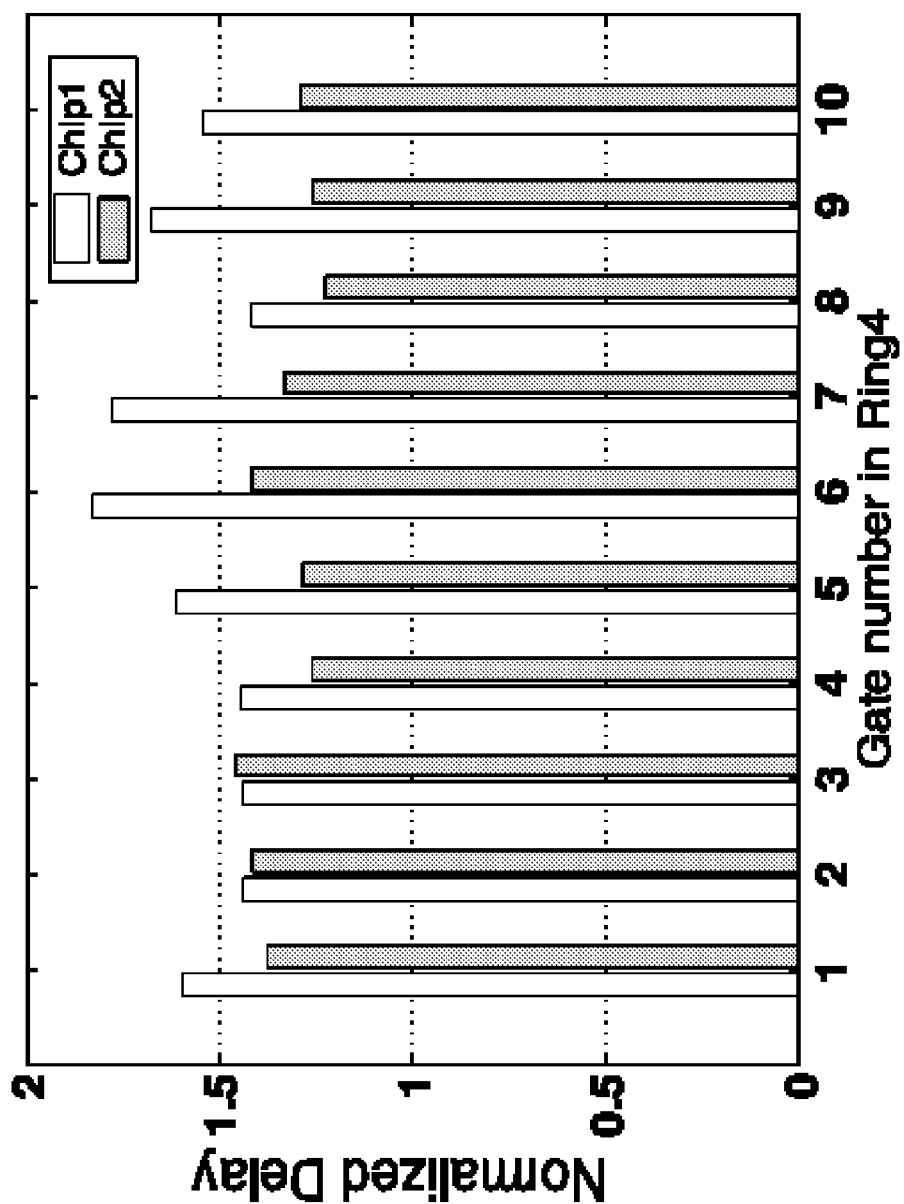
FIG. 6 illustrates example measured individual delays of a logic gate from two different chips.

FIG. 6 illustrates example measured individual delays of inverter $I_1$ (as seen in FIG. 2) normalized to a fan-out 1 loaded inverter in each of 10-stages of the same ring from two different chips. The inverter to inverter delay in the ring, as a percentage of a mean delay, was seen to vary by up to 26% for chip 1 and up to 17.4% for chip 2, which indicates the effect of intra-chip local variations. There was no discernible pattern of variation for the delays within the same ring. Between the two chips, the variation pattern has some similarity for stages 4 to 8, but is different for the rest of the stages indicating the randomness of the local or within-die variations. The measurements were also correlated to results from a statistical simulation, and it was determined that out of 20 measured delays from two chips (as shown in FIG. 6), 17 points were well within a distribution and the rest of the points were toward a tail of the distribution.

Figure 7B:
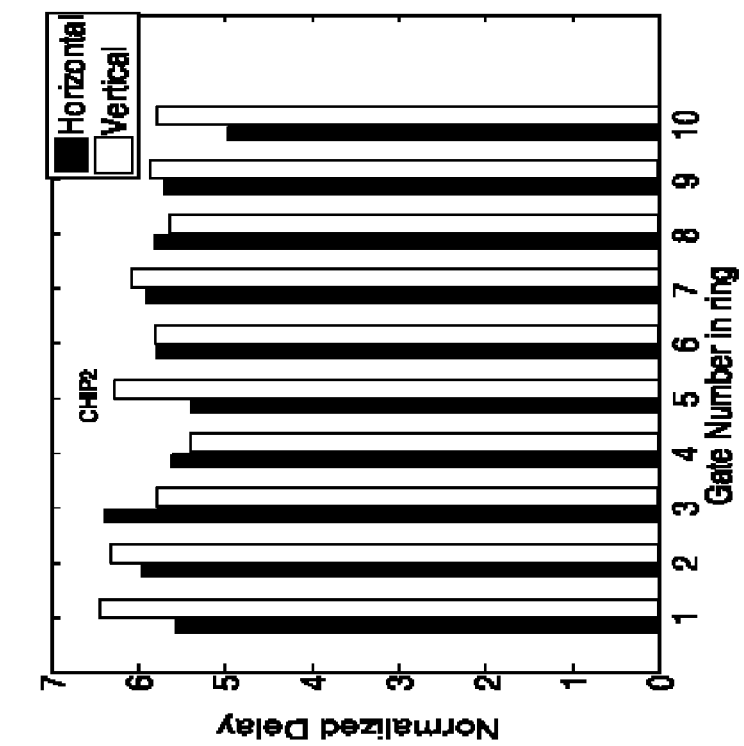
FIGS. 7A-7B illustrate example graphs that show a gate delay measurement variation due to an orientation of ring oscillators in a chip.
Figure 7A:
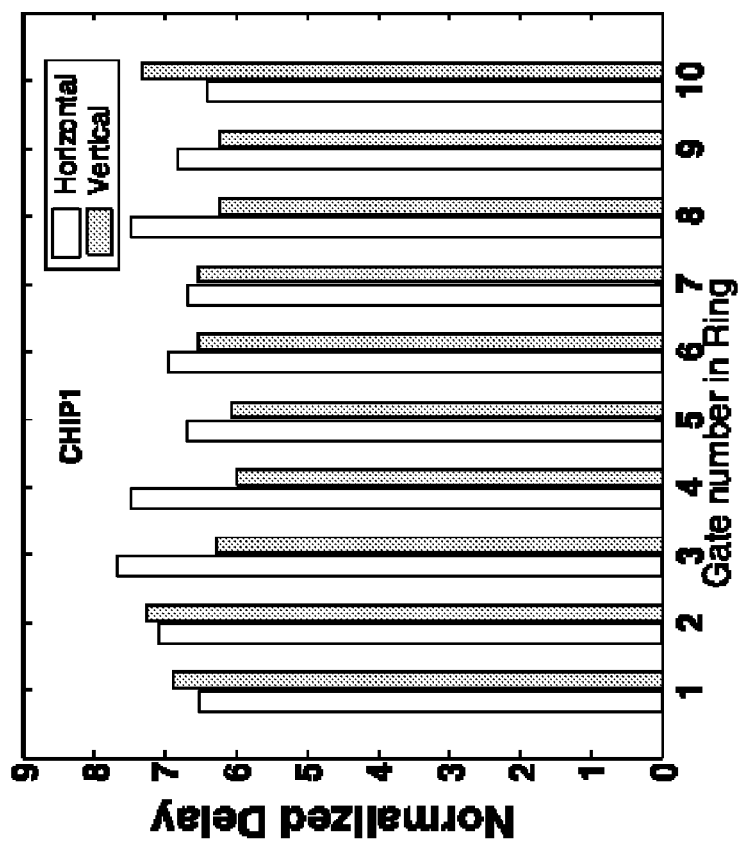

FIGS. 7A-7B illustrate example graphs to show a gate delay measurement variation due to an orientation of the ring oscillators in the chip. Orientation differences of a ring oscillator can lead to changes in characteristics of the transistors, which arise due to the manufacturing process.

FIG. 7A illustrates example results of delays of the 10 inverters in two ring oscillators with one ring oscillator configured in as a vertical ring oscillator and the other ring oscillator configured as a horizontal ring oscillator. In the first chip, a delay spread of about 19% resulted. Note that in these two rings, the inverter has a different size, layout, and loading as compared to the ring used for the experiments that gave the results illustrated in FIG. 6. The pattern of local delay variation is different for the vertical and horizontal cells.

FIG. 7B illustrates example results of delays of the 10 identical inverters using horizontal and vertical ring oscillators for the second chip. Comparison of the results shown in FIGS. 7A-7B shows that gate numbers 1, 2, 3, 4, 8 and 10 have a pattern of similarity and the rest of the gates show opposite patterns signifying the importance of random variation.

Figure 8B:
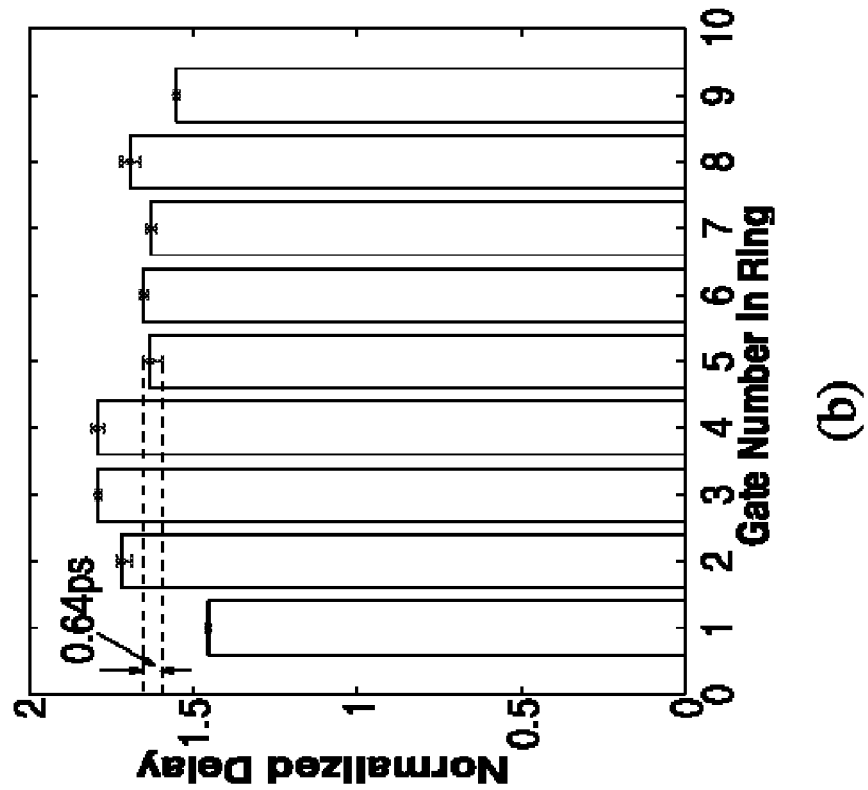
FIG. 8B illustrates example results of error in measured delays.
Figure 8A:
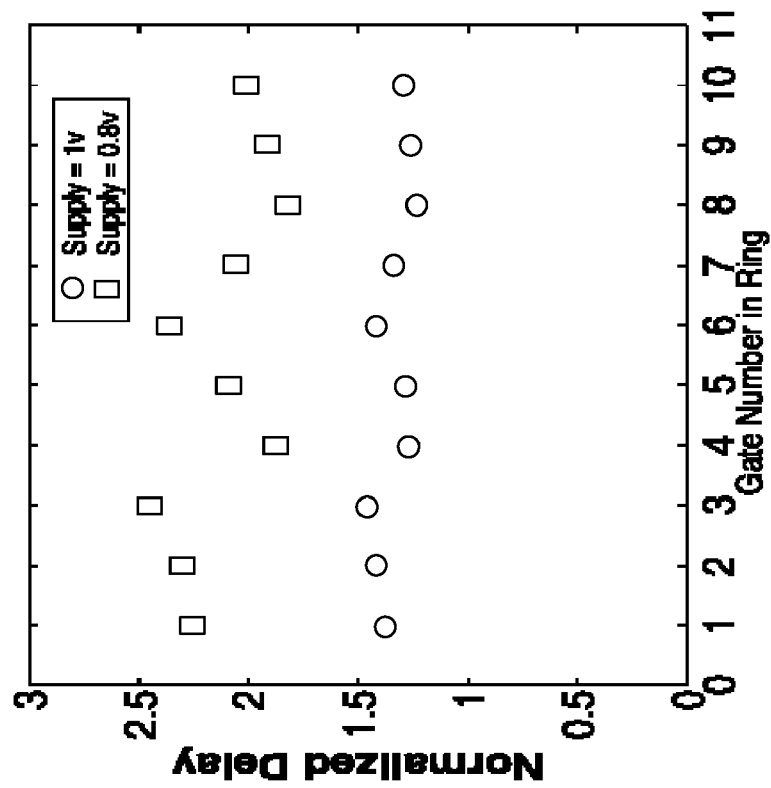
FIG. 8A illustrates example results of the measured delay variations of 10 cells in a ring for two different supply voltages.
Figures 7A, 7B:
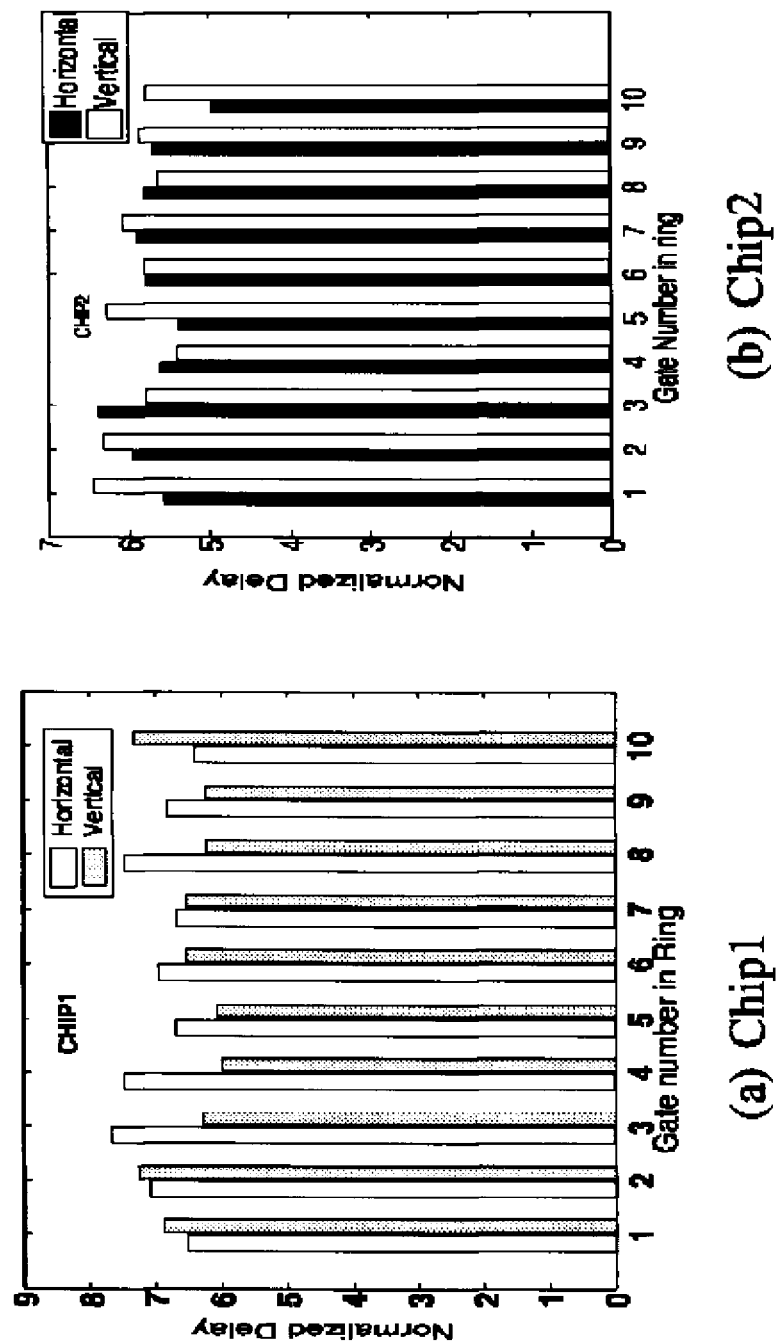
Figure 8B:
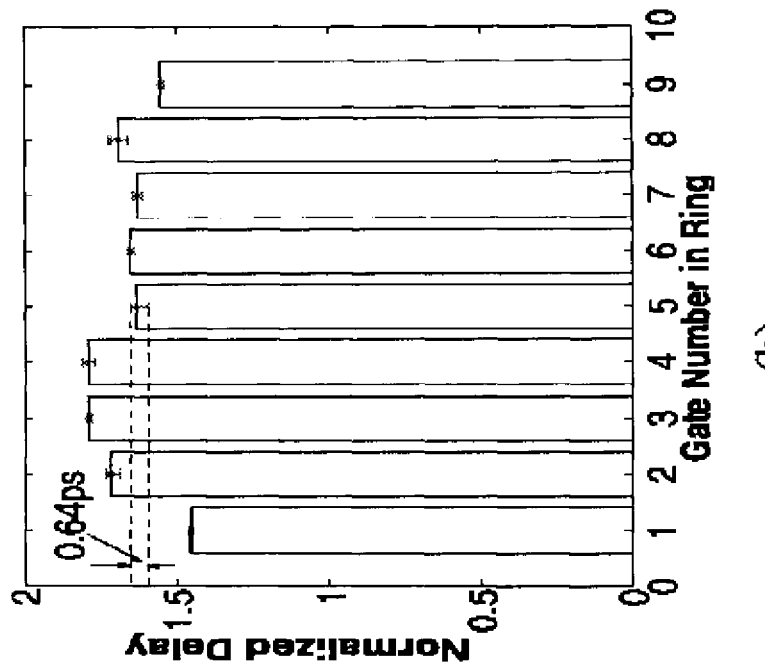
Figure 8A:
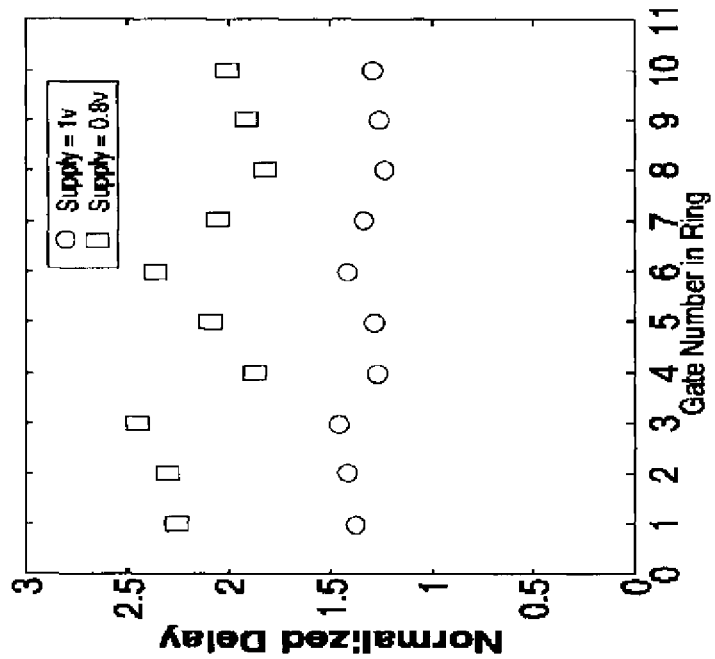

FIG. 8A illustrates example results of the measured delay variations of the 10 cells in a ring for two different supply voltages. The delay and the delay spread at 0.8V are more than that observed for 1V, but the pattern of variation is the about same. As the supply voltage is decreased, the spread in delays increases from 17% at 1V to 29% at 0.8V which indicates that the main source of local variations is the process.

FIG. 8B illustrates example results of the error in delay measurement. The same gate delay can be measured in multiple ways because the number of equations is more than the number of variables. The number of equations equates to the number of different ring oscillator configuration settings and the number of variables is the number of gate delays to be measured. FIG. 8B shows 9 different gates, and each gate delay is measured in 6 different ways. A maximum error in delay measurement illustrated in FIG. 8B is found to be 0.64 ps. Thus, the delay measurement can be made to be within 1 ps accuracy. The measurements indicate that local gate to gate variations can be significant in advanced process nodes and need to be accounted for in models and design practices.

Using the embodiments described herein, a delay of individual gates in a chip can be measured using reconfigurable ring oscillators that are in a standard cell library inside the chip. The delay measurements can be performed without interrupting a normal state of a system designed on the chip (in-situ measurements). The delay measurement technique is suitable for early process characterization, monitoring mature process in manufacturing, correlating model-to-hardware studies, and to identify local variation and neighborhood effects, for example. Delays of gates can be measured for any type of gate in the cell library (e.g., any inverting or non-inverting gate).

In general, it should be understood that the circuits described herein may be implemented in hardware using integrated circuit development technologies, or yet via some other methods, or the combination of hardware and software objects that could be ordered, parameterized, and connected in a software environment to implement different functions described herein. For example, the present application may be implemented using a general purpose or dedicated processor running a software application through volatile or non-volatile memory. Also, the hardware objects could communicate using electrical signals, with states of the signals representing different data.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

What is claimed is:

1. A method of determining a delay of a logic gate under test, comprising:
   providing a gate delay measurement circuit that includes a multi-stage ring oscillator and the logic gate under test within the multi-stage ring oscillator;
   making a first measurement of a period of the gate delay measurement circuit with all stages of the multi-stage ring oscillator present;
   making subsequent measurements of periods of the gate delay measurement circuit with one or more stages of the multi-stage ring oscillator removed while still enabling the multi-stage ring oscillator to oscillate; and
   determining a delay of the logic gate under test based on a linear combination of the first measurement of the period of the gate delay measurement circuit and the subsequent measurements of the periods of the gate delay measurement circuit.

2. The method of claim 1, wherein a logic gate is coupled to an input of each stage of the multi-stage ring oscillator, and wherein each stage of the multi-stage ring oscillator includes a multiplexer that receives an output of the logic gate and an input to the logic gate, and selectively passes either the output of the logic gate or the input to the logic gate, and wherein making the first measurement of the period of the gate delay measurement circuit with all stages of the multi-stage ring oscillator present is performed according to the following equation:

$$\sum_{i=1}^{n}(X_i + M_{Ai}) + K = \frac{T}{2},$$

wherein $X_i$ is an average of rise and fall delay of the ith logic gate, $M_{Ai}$ is a delay between a first input to the multiplexer that receives the output of the logic gate and an output of the multiplexer, K is a delay of remaining elements of each stage of the multi-stage ring oscillator, n is a number of stages of the multi-stage ring oscillator, and T is the first measurement of the period of the gate delay measurement circuit.

3. The method of claim 1, wherein a logic gate is coupled to an input of each stage of the multi-stage ring oscillator, and wherein each stage of the multi-stage ring oscillator includes a multiplexer that receives an output of the logic gate and an input to the logic gate and selectively passes either the output of the logic gate or the input to the logic gate, and wherein making the subsequent measurements of periods of the gate delay measurement circuit with one or more stages of the multi-stage ring oscillator removed while still enabling the multi-stage ring oscillator to oscillate comprises:
   causing multiplexers to pass the input to the logic gate so as to bypass the logic gate within one of more stages of the multi-stage ring oscillator.

4. The method of claim 1, wherein a logic gate is coupled to an input of each stage of the multi-stage ring oscillator, and wherein each stage of the multi-stage ring oscillator includes a multiplexer that receives an output of the logic gate and an input to the logic gate and selectively passes either the output of the logic gate or the input to the logic gate, and the method further comprises:
   removing a logic gate from one of more stages of the multi-stage ring oscillator by causing multiplexers to pass the input to the logic gate so as to bypass the logic gate.

5. The method of claim 4, further comprising establishing linear equations that describe periods of the gate delay measurement circuit with a logic gate removed from one or more stages of the multi-stage ring oscillator while still enabling the multi-stage ring oscillator to oscillate using the following equation:

$$\sum_{i=n}(X_i + M_{Ai}) + \sum_{i=m} M_{Bi} + K = \frac{T}{2},$$

wherein $X_i$ is an average of rise and fall delay of the ith logic gate, $M_{Ai}$ is a delay between a first input to the multiplexer that receives the output of the logic gate and an output of the multiplexer, $M_{Bi}$ is a delay between a second input to the multiplexer that receives the input to the logic gate and an output of the multiplexer, K is a delay of remaining elements of each stage of the multi-stage ring oscillator, n is a number of stages of the multi-stage ring oscillator where a logic gate is present, m is a number of stages of the multi-stage ring oscillator where a logic gate has been removed, and T is a measurement of the period of the gate delay measurement circuit.

6. The method of claim 4, further comprising:
establishing linear equations that describe periods of the gate delay measurement circuit with a logic gate of one or more stages of the multi-stage ring oscillator removed while still enabling the multi-stage ring oscillator to oscillate; and
selectively combining the linear equations in a manner so as to cancel delays of all logic gates except the delay of the logic gate under test.

7. The method of claim 1, wherein a logic gate is coupled to an input of each stage of the multi-stage ring oscillator, wherein the logic gate under test is the logic gate coupled to an input for one of the stages of the multi-stage ring oscillator, and wherein each stage of the multi-stage ring oscillator includes a multiplexer that receives an output of the logic gate and an input to the logic gate and selectively passes either the output of the logic gate or the input to the logic gate, and the method further comprises:
removing a logic gate from one of more stages of the multi-stage ring oscillator by causing multiplexers to pass the input to the logic gate so as to bypass the logic gate;
establishing linear equations that describe periods of the gate delay measurement circuit with a logic gate removed from one or more stages of the multi-stage ring oscillator while still enabling the multi-stage ring oscillator to oscillate, wherein the linear equations equate delays of the logic gates and stages of ring oscillators to periods of the gate delay measurement circuit; and
selectively combining the linear equations in a manner so as to cancel delays of all logic gates except the delay of the logic gate under test.

8. The method of claim 7, further comprising determining a delay of one of the logic gates coupled to the input of a stage of the multi-stage ring oscillator.

9. The method of claim 8, wherein determining the delay of a given one of the logic gates coupled to the input of a stage of the multi-stage ring oscillator comprises:
selectively combining the linear equations in a manner so as to cancel delays of all logic gates except the given one of the logic gates.

10. The method of claim 1, wherein the multi-stage ring oscillator includes an odd number of stages, and wherein making the subsequent measurements of periods of the gate delay measurement circuit with one or more stages of the multi-stage ring oscillator removed while still enabling the multi-stage ring oscillator to oscillate comprises:
removing one or more pairs of stages of the multi-stage ring oscillator.

11. The method of claim 1, further comprising reconfiguring stages of the multi-stage oscillator prior to making the subsequent measurements of periods of the gate delay measurement circuit, and wherein the logic gate under test is coupled to one of the reconfigured stages of the multi-stage ring oscillator.

12. The method of claim 11, wherein the multi-stage ring oscillator includes an odd number of stages and wherein making the subsequent measurements of periods of the gate delay measurement circuit comprises:
making a measurement of the period of the gate delay measurement circuit a number of times equal to a number of reconfigured stages.

13. The method of claim 12, wherein each measurement is made with a pair of reconfigured stages removed, and wherein each reconfigured stage is not removed for only one measurement.

14. A gate delay measurement circuit, comprising:
a reconfigurable ring oscillator including one or more stages, wherein the one or more stages are arranged in a ring with an output of one stage being an input to a subsequent stage;
a delay measurement element coupled to the reconfigurable ring oscillator, the delay measurement element operable to make a first measurement of a period of the reconfigurable ring oscillator with all stages of the reconfigurable ring oscillator present and to make subsequent measurements of periods of the reconfigurable ring oscillator with one or more stages of the reconfigurable ring oscillator removed while still enabling the reconfigurable ring oscillator to oscillate; and
a processor coupled to the reconfigurable ring oscillator and to the delay measurement element, the processor operable to output a configuration vector to the reconfigurable ring oscillator that includes a control word for each of the one or more stages and controls whether a stage will be removed from the reconfigurable ring oscillator, and wherein the processor determines a delay of a logic gate under test within the reconfigurable ring oscillator based on a linear combination of the first measurement of the period of the reconfigurable ring oscillator and the subsequent measurements of the periods of the reconfigurable ring oscillator.

15. The gate delay measurement circuit of claim 14, further comprising:
a logic gate coupled to an input of each stage of the reconfigurable ring oscillator; and
a multiplexer within each stage of the reconfigurable ring oscillator that receives an output of the logic gate and an input to the logic gate and selectively passes either the output of the logic gate or the input to the logic gate based on the configuration vector.

16. The gate delay measurement circuit of claim 15, wherein the processor establishes linear equations that describe periods of the reconfigurable ring oscillator with a logic gate of one or more stages of the reconfigurable ring oscillator removed while still enabling the multi-stage ring oscillator to oscillate, and selectively combines the linear equations in a manner so as to cancel delays of all logic gates except the delay of the logic gate under test.

17. The gate delay measurement circuit of claim 14, wherein the reconfigurable ring oscillator includes an odd number of stages, and wherein the delay measurement element makes the subsequent measurements of periods of the reconfigurable ring oscillator with one or more pairs of stages removed.

18. The gate delay measurement circuit of claim 14, wherein the reconfigurable ring oscillator includes an odd number of stages, and wherein the delay measurement element makes a measurement of the period of the reconfigurable ring oscillator a number of times equal to a number of reconfigured stages, wherein each measurement is made with a pair of reconfigured stages removed, and wherein each reconfigured stage is not removed for only one measurement.

19. A non-transitory computer readable medium having stored therein instructions executable by a computing device to perform the functions of:
- making a first measurement of a period of a gate delay measurement circuit, the gate delay measurement circuit including a multi-stage ring oscillator and a logic gate under test within the multi-stage ring oscillator, wherein the first measurement of the period of the gate delay measurement circuit occurs with all stages of the multi-stage ring oscillator present;
- making subsequent measurements of periods of the gate delay measurement circuit with one or more stages of the multi-stage ring oscillator removed while still enabling the multi-stage ring oscillator to oscillate; and
- determining a delay of the logic gate under test based on a linear combination of the first measurement of the period of the gate delay measurement circuit and the subsequent measurements of the periods of the gate delay measurement circuit.

20. The non-transitory computer readable medium of claim 19, wherein the instructions are further executable by the computing device to perform the function of outputting a configuration vector to the multi-stage ring oscillator that includes a control word for each of the one or more stages and controls whether a stage will be removed from operation of the multi-stage ring oscillator.

* * * * *

UNITED STATES PATENT AND TRADEMARK OFFICE
CERTIFICATE OF CORRECTION

PATENT NO. : 8,224,604 B1
APPLICATION NO. : 12/539372
DATED : July 17, 2012
INVENTOR(S) : Amrutur et al.

It is certified that error appears in the above-identified patent and that said Letters Patent is hereby corrected as shown below:

On the Title Page, in Item (56), under "OTHER PUBLICATIONS", in Column 1, Line 8, delete "1si" and insert -- lsi --, therefor.

On Title Page 2, in Item (56), under "OTHER PUBLICATIONS", in Column 1, Line 6, delete "Conf" and insert -- Conf. --, therefor.

On Title Page 2, in Item (56), under "OTHER PUBLICATIONS", in Column 2, Line 3, delete "Vol:" and insert -- Vol. --, therefor.

In the Drawings

In Fig. 7A, Sheet 6 of 7, delete "Normallzed" and insert -- Normalized --, as per attached sheet.

In Fig. 8A, Sheet 7 of 7, delete "Normallzed" and insert -- Normalized --, as per attached sheet.

In the Claims

In Column 14, Line 41, in Claim 3, delete "one of more" and insert -- one or more --, therefor.

In Column 14, Line 50, in Claim 4, delete "one of more" and insert -- one or more --, therefor.

In Column 15, Line 29, in Claim 7, delete "one of more" and insert -- one or more --, therefor.

Signed and Sealed this
Eleventh Day of June, 2013

Teresa Stanek Rea
*Acting Director of the United States Patent and Trademark Office*